US007283017B2

(12) United States Patent
Galaz Villasante et al.

(10) Patent No.: US 7,283,017 B2
(45) Date of Patent: Oct. 16, 2007

(54) BAND PASS FILTER

(75) Inventors: Juan Sebastian Galaz Villasante, Madrid (ES); Ana Isabel Daganzo Eusebio, Madrid (ES); Manuel Jesus Padilla Cruz, Madrid (ES); Magdalena Salazar Palma, Madrid (ES); Sergio Llorente Romano, Madrid (ES); Alejandro Garcia Lamperez, Madrid (ES)

(73) Assignee: Thales, Neuilly sur Seine (FR)

( * ) Notice: Subject to any disclaimer, the term of this patent is extended or adjusted under 35 U.S.C. 154(b) by 17 days.

(21) Appl. No.: 10/921,835

(22) Filed: Aug. 20, 2004

(65) Prior Publication Data

US 2005/0040913 A1 Feb. 24, 2005

(30) Foreign Application Priority Data

Aug. 22, 2003 (EP) .................................. 03292072

(51) Int. Cl.
*H01P 5/02* (2006.01)
*H03H 7/38* (2006.01)

(52) U.S. Cl. ........................................ 333/134; 333/33

(58) Field of Classification Search ............... 333/17.3, 333/32, 33, 263, 134
See application file for complete search history.

(56) References Cited

U.S. PATENT DOCUMENTS 5,065,119 A * 11/1991 Jachowski .................. 333/202
5,191,304 A * 3/1993 Jachowski .................. 333/202
5,442,330 A * 8/1995 Fuller et al. ................ 333/204
5,939,939 A * 8/1999 Gaynor et al. .......... 330/124 R
6,023,608 A * 2/2000 Yrjola et al. ................. 455/78
6,067,461 A 5/2000 Ye et al.
6,255,920 B1 * 7/2001 Ohwada et al. ............. 333/206
6,577,211 B1 * 6/2003 Tsujiguchi .................. 333/204
6,608,538 B2 * 8/2003 Wang .......................... 333/204
6,781,476 B2 * 8/2004 Tsunoda et al. ............ 333/110
6,995,635 B2 * 2/2006 Wung et al. ................ 333/204
2006/0158285 A1 * 7/2006 Lee ............................ 333/204

FOREIGN PATENT DOCUMENTS

EP 1 172 880 A1 1/2002

* cited by examiner

*Primary Examiner*—Robert Pascal
*Assistant Examiner*—Kimberly E Glenn
(74) *Attorney, Agent, or Firm*—Sughrue Mion, PLLC

(57) ABSTRACT

Planar band pass filter includes several planar resonators (Ri) arrange parallely, such that the input (R1) and output (R5) planar resonators are connected to input (11) and output (12) feed lines, respectively, and the connections between the input (R1) and output (R2) planar resonators and the input (11) and output (12) feed lines are made by means of high impedance lines (14), respectively, such that the direction of propagation of the signal from the input to the output of the filter remains invariable between the feed lines, the high impedance lines (14), the corresponding resonators, and the rest of the filter resonators.

10 Claims, 2 Drawing Sheets

BAND PASS FILTER

OBJECT OF THE INVENTION

The present invention relates to a planar circuit that filters within its bandwidth the received uplink signal of a satellite communication system and divides its power into several outputs. More particularly, the present invention relates to a microwave planar band pass filter and a power divider that filters and generates two duplicates of the uplink signal.

STATE OF THE ART

In G. Prigent, E. Rius, F. Le Pennec, S. Le Maguer, M. Ney, and M. Le Floch, "DOE Based Design Method For Coupled-Lines Narrow Bandpass Filter Response Improvement", 32$^{nd}$ European Microwave Conference, Milan, October 2002, (LEST-UBO/ENST-Br, BP 809, 29285 Brest Cedex, France) a planar narrow bandwidth band pass filter is described comprising five microstrip lines which make up the resonators of the filter. These resonators are coupled to one another in a parallel fashion, namely with an edge-coupled structure. Each line conductor is of a predetermined width and length, namely the length is equal to half the wavelength, with respect to the central frequency of the band pass filter. The coupling between one resonator and the next one is performed placing them parallel to one another and close enough, namely edge-coupling, over a quarter wavelength of the mentioned resonators. The filter described up to now is a classical structure that will generate a frequency response with no finite transmission zeros. Prigent et al. add an improvement to the filter performance designed so far by modifying the topology of the filter in order to introduce a finite transmission zero in the amplitude response of the filter. This is obtained by incorporating a coupling between non-adjacent resonators, namely resonators 2 and 4. The five microstrip resonators are arranged in a V-shaped form so that an end-coupling, namely, a gap is obtained between resonators 2 and 4, shown in FIG. 1.

The input and output of classical coupled line filters are usually obtained through additional input and output quarter wavelength lines edge-coupled to the first and last resonators, i.e., in the example mentioned, to resonators 1 and 5, respectively. In their work Prigent et al. adopt a different approach by using tapped lines, namely input and output microstrip lines connected at a given point of the first and last resonators perpendicularly to the mentioned resonators. This solution allows higher bandwidths than when using the previously described input and output lines edge-coupled to the input and output resonators, i.e., in a parallel fashion. Prigent et al. justify its use as a means to improve the insertion loss of the filter.

It should be noted that, since the input and output lines are perpendicular to the input and output resonators, respectively, the size of this configuration, namely its width, is larger than that of the classical configuration. The FIG. 1 shows the feeding lines.

Planar devices in general and planar filters in particular are shielded by a metallic housing in order to suppress power radiation. A disadvantage of the planar filter of Prigent et al. is that since the input and output feed lines are perpendicular to the microstrip line resonators the width of the housing needs to be quite high leading to a heavy and bulky housing of the filter. Accordingly, the higher size of both the filter and the housing requires more substrate and housing material in the manufacturing process and, hence, it is more expensive.

However, the major drawback of the filter topology proposed by Prigent et al. is that the higher width of the housing allows the propagation of not only the fundamental electromagnetic mode but also of higher order electromagnetic modes which degrade the out of band rejection characteristics of the filter response, giving rise to higher pass bands. These higher pass bands should be avoided in order not to interfere with other communication systems. Moreover, the insertion and return losses of the band pass filter are degraded by these higher pass bands.

Furthermore it should be noted that the direction of propagation of the signal in the filter by Prigent et al. is not invariable since the input and output lines are perpendicular to the direction of propagation on the filter itself, that is, along the resonators. In other words, the solution by Prigent et al. has the disadvantage of requiring a T type discontinuity between the input and output lines and the first and last resonators, respectively. This type of discontinuities may not be exactly replicated during the production process so that fabricated filters may differ one from the other, requiring additional adjustments during the fabrication process.

Nowadays microwave engineers are striving to achieve a minimum of mass and volume of microwave devices used for satellite communication systems since spacecraft transport these appliances. Therefore, there is a need to achieve a minimum of mass and size and reduced cost for microwave planar filters suitable for input planar devices that filter and divide the input signal according to the bandwidth of the uplink of satellite communication systems. The filtered signals at the different outputs of the power divider are directed to different input multiplexers (IMUXs) that apply different treatments to the corresponding input signals.

CHARACTERISATION OF THE INVENTION

The present invention refers to a planar band pass filter that includes several planar resonators that are arranged parallely, such that the input and output planar resonators are connected to input and output feed lines, respectively, and the connections between the input and output planar resonators and the input and output feed lines are made by means of high impedance lines, respectively, such that the direction of propagation of the signal from the input to the output of the filter remains invariable between the feed lines, the high impedance lines, the corresponding resonators, and the rest of the filter resonators.

This simple fact leads to excellent performance of the filter, because this geometrically linear or longitudinal configuration allows shielding of the filter by means of a rectangular wave-guide of reduced cross section, namely, reduced width, which implies that the wave-guide is under-cut-off, so that higher order modes will not propagate along the filter. Thus, higher pass bands will not degrade the out-of-band performance. The pass band insertion and return losses of the filter are also optimized.

As a consequence of the geometrically linear or longitudinal topology of the filter another objective of the present invention is obtained, characterized in that an improved microwave planar band pass filter is achieved having a substantially smaller width than many prior art planar filters. Obviously, a more compact design is obtained. Accordingly, the overall microwave planar filter is lightweight, has reduced size and cost.

Furthermore, T discontinuities are avoided, reducing fabrication adjustments, production time and production cost of the filters.

Finally, the use of high impedance lines as connections between the input and output feeding lines and the input and output resonators, respectively, is capable of obtaining band pass filters of moderate to high bandwidth, as is usually the case when dealing with the bandwidth of the uplink signals of satellite communication systems.

BRIEF DESCRIPTION OF THE DRAWINGS

The characteristics and advantages of the invention will become more clear with a detailed description thereof, taken together with the attached drawings, in which.

DESCRIPTION OF THE INVENTION

Figure 2:
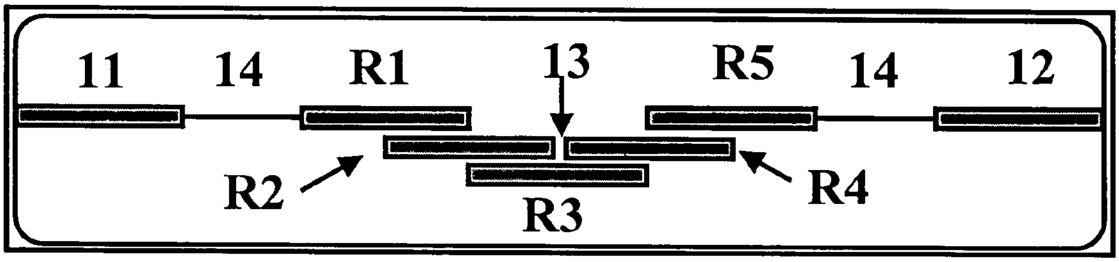
FIG. 2 shows an upper view of an example of the shielded band pass filter according to the invention.

FIG. 2 illustrates a shielded planar band pass filter with edge-coupled structure in V-shape form. The filter includes several resonators, for example, five, R1, . . . , R5 coupled in parallel fashion, namely edge-coupled configuration along a given section of its length, where the input 11 and output 12 feeding lines are connected to the first R1 and fifth R5 resonators through high impedance lines 14 leading to a geometrically linear or longitudinal configuration. The housing is also shown.

Each section of two parallel-coupled conductors has a length equal to a quarter wavelength (λ/4) at the centre frequency of the filter. Thus, the length of each resonator Ri is equal to half a wavelength at the centre frequency. The second R2 and fourth R4 resonators are coupled not only to the first R1 and third R3 resonators and the third R3 and fifth R5 resonators, respectively, but also between them through the proximity of their open ends in a gap 13 configuration. The input R1 and output R2 resonators of the filter are connected to high impedances lines 14, these high impedance lines being connected to the input 11 and output 12 feeding lines. Each resonator Ri, as well as the high impedance lines 14 and feeding lines 11, 12, has a planar flat shape.

Note that, for the description of the present invention an example of a five-pole microstrip band pass filter has been taken.

It should be observed that the separation between the various edge-coupled resonators sections is selected to obtain the intended bandwidth.

Edge-coupled resonators Ri are inductively coupled because the resonators R1, . . . , R5 are longitudinally coupled parallely. This type of coupling is used for the direct path from the input R1 resonator to the output R5 resonator.

A cross coupling is created between non-contiguous resonators by means of a capacitive coupling, namely a gap 13 between the open ends of two non-contiguous resonators, the second R2 and fourth resonators R4. Thus, the third R3 resonator is coupled to the second R2 and fourth R4 resonators through quarter wavelength sections as usual, except for the fact that the total length of the third R3 resonator is equal to a half wavelength plus the length of the gap 13. This capacitive coupling creates a finite-frequency transmission zero at the upper transition band of the planar band pass filter.

Note that the frequency value of the transmission zero increases while increasing the gap 13 dimension. Physically, the gap 13 coupling capacitance provides a second path for the electromagnetic energy travelling across the gap 13. This second path for the transmission of the electromagnetic energy gives rise to the transmission zero. The transmission zero is located on the upper transition band to achieve asymmetric frequency selectivity, namely, with high selectivity in the upper transition band as required for satellite communication systems uplink filtering applications.

Figure 1:
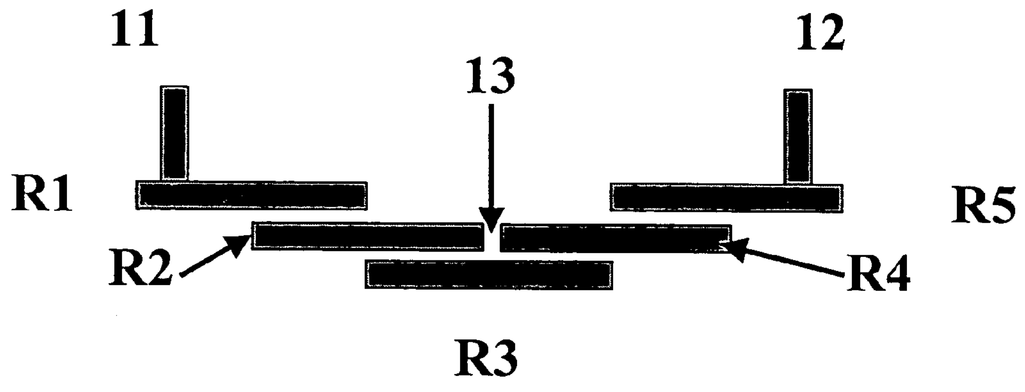
FIG. 1 shows an upper view of the configuration of the filter from Prigent et al.

The input R1 and output R5 resonators are connected to the input 11 and output 12 feed lines, respectively, by means of high impedance lines 14 of planar type, in a geometrically linear or longitudinal configuration. Thus, the connections avoid the perpendicular lines 11, 12 of FIG. 1, while keeping a geometrically linear configuration also called longitudinal configuration. Therefore, the filter has a linear geometry or longitudinal geometry that reduces its width and the width of the required housing, so that the excitation and propagation of higher order modes are avoided.

Furthermore, the filter size is minimized which implies that the substrate (in the case of a microstrip filter) or the dielectric (in the case of dielectrically supported strip line filters) and, in any case, the housing material, are minimized.

The dimensions (width and length) of the high impedance lines 14 are designed to obtain the required bandwidth (moderate relative bandwidth) and to obtain the desired return losses. For example, the length could be close or equal to quarter-wavelength (λ/4) at the centre frequency of the filter.

The filter employs strip line type resonators, microstrip resonators, or the like.

Figure 3:
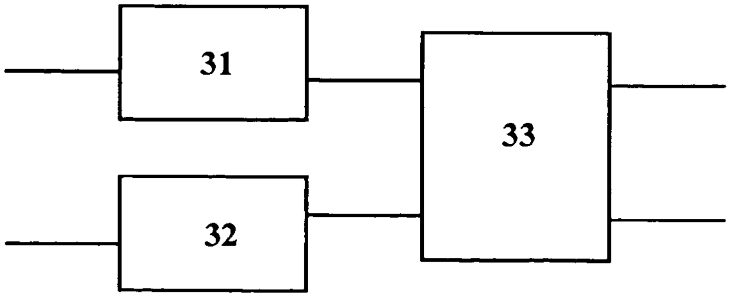
FIG. 3 shows the block diagram of an example of an input device according to the invention.

FIG. 3 depicts the block diagram of an embodiment of an input device for the uplink of a satellite communications system. The objective of this device, taken as example, is to generate two duplicates of the received signal, filtered within the band of interest, in order to apply a different treatment to each of them (e.g., to separate the even channels of the IMUX connected to one of the outputs of the power divider 33, from the odd channels of the IMUX, connected to the other output; this previous division of the signal allows the IMUX channels filters to have lower selectivity and be simpler, since the channel-to-channel guard bands are greatly increased). It should be observed that the number of outputs could be greater than two, i.e., that the signal could be divided, using the adequate power divider into two or more outputs. Furthermore, observe that for the generation of such filter duplicates, only one filter, connected to one of the inputs of the divider, is required, since the second input could be just loaded with the characteristic impedance, e.g. a 50 Ohms resistor. FIG. 3 covers the more general possibility of two filters 31, 32 connected to each input port of the power divider 33. Moreover, the number of inputs of the power divider could be just one, to which the band pass filter would be connected.

Figure 4:
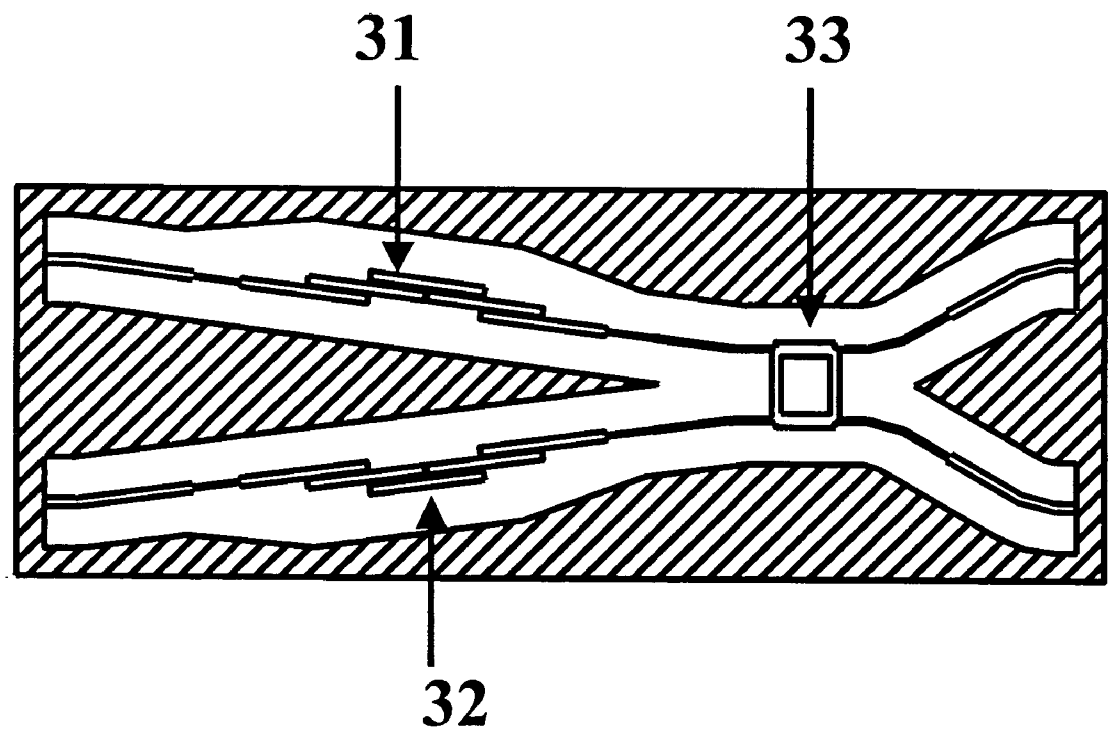
FIG. 4 shows an example of a planar technology embodiment of the block diagram of FIG. 3, using two filters with the topology of FIG. 2, and a broadband power divider consisting on a 3 dB branch line.

FIG. 4 depicts the embodiment of FIG. 3 using planar technology (microstrip or strip line). The power divider 33 has been implemented as a 3 dB hybrid, namely a 3 dB branch-line. In order to increase the bandwidth of the 3 dB branch-line high impedance lines are used whose width and length are designed in order to obtain the required bandwidth coupling and insulation specifications. The housing of the input device is such that the width of the different wave-guides that shield each component of the input device does not allow the propagation of higher order modes, in order to obtain a good out of band rejection.

The reduction on the size of the housing minimizes the mass, volume and cost of the device.

It should be noted that the excellent electrical and physical performances of the device are due mainly to the use of high impedance lines 14 as connecting elements between the feeding lines 11, 12 of the filter and its input R1 and output R5 resonators and that this fact implies that the propagation of the signal is invariable along the filter.

The present invention has been described with reference to an example. Those skilled in the art as taught by the foregoing description may contemplate improvements, changes and modifications. Such improvements, changes and modifications are intended to be covered by the appended claims.

The invention claimed is:

1. A planar filter including an input and an output feeding line; wherein each of the input and the output feeding line is connected to an input and an output resonator, respectively, by high impedance lines, such that a propagation direction of a signal remains invariable across the input and the output feeding line, the connecting high impedance lines, and the input and the output resonator.

2. Filter according to claim 1, wherein the propagation direction of the signal remains invariable through a plurality of resonators.

3. Filter according to claim 2, including at least a finite-frequency transmission zero.

4. Filter according to claim 2, wherein the plurality of resonators are arranged to have a gap, creating a cross coupling, between open ends of two non-contiguous resonators in the longitudinal direction.

5. Filter according to claim 1, wherein the input and output resonators are microstrip resonators.

6. Filter according to claim 1, wherein the input and output resonators are strip line.

7. Filter according to claim 1, wherein the input and output feeding lines are arranged in parallel, in a longitudinal direction, with respect to the input and output resonators.

8. An input planar device suitable for demultiplexers, comprising: a planar filter including an input and an output feeding line; wherein each of the input and the output feeding line is connected to an input and an output resonator, respectively, by high impedance lines, such that a propagation direction of a signal remains invariable across the input and the output feeding line, the connecting high impedance lines, and the input and the output resonator; wherein the planar filter is connected to an input of a power divider.

9. Input planar device according to claim 8, wherein the power divider is a 3 dB hybrid coupler.

10. Input planar device according to claim 9, wherein the power divider is a 3 dB branch line.

* * * * *